United States Patent
Hassel et al.

(10) Patent No.: US 9,678,129 B2
(45) Date of Patent: Jun. 13, 2017

(54) DEVICE AND METHOD FOR MONITORING THE STATE OF A SYSTEM COMPONENT

(75) Inventors: Jörg Hassel, Erlangen (DE); Gotthard Rieger, München (DE); Roland Weiss, Erlangen (DE); Hermann-Josef Wiegand, Rasdorf (DE)

(73) Assignee: SIEMENS AKTIENGESELLSCHAFT, München (DE)

( * ) Notice: Subject to any disclaimer, the term of this patent is extended or adjusted under 35 U.S.C. 154(b) by 100 days.

(21) Appl. No.: 14/239,418

(22) PCT Filed: Aug. 18, 2011

(86) PCT No.: PCT/EP2011/064228
§ 371 (c)(1),
(2), (4) Date: Feb. 18, 2014

(87) PCT Pub. No.: WO2013/023700
PCT Pub. Date: Feb. 21, 2013

(65) Prior Publication Data
US 2014/0191766 A1 Jul. 10, 2014

(51) Int. Cl.
*G01R 31/02* (2006.01)
*G01R 33/09* (2006.01)

(52) U.S. Cl.
CPC ........... *G01R 31/02* (2013.01); *G01R 33/093* (2013.01)

(58) Field of Classification Search
CPC ... G01R 19/0092; G01R 31/02; G01R 33/093
(Continued)

(56) References Cited

U.S. PATENT DOCUMENTS 5,708,407 A * 1/1998 Mouchot et al. ........... 338/32 R
6,433,981 B1 * 8/2002 Fletcher et al. ............. 361/93.1
(Continued)

FOREIGN PATENT DOCUMENTS

CN 101363903 2/2009
DE 102006019483 10/2007
(Continued)

OTHER PUBLICATIONS

Niedermeier, U. et al, Enhancement of organic magnetoresistance by electrical conditioning, May 15, 2008, Applied Physics Letters 92, 193309 (2008), p. 1-3.*
(Continued)

*Primary Examiner* — Melissa Koval
*Assistant Examiner* — Rahul Maini
(74) *Attorney, Agent, or Firm* — Henry M. Feiereisen LLC

(57) ABSTRACT

In order to detect the current state of a system component, e.g. to display whether an electrical conductor, a cable or the like, is currently live, a field generator that generates a magnetic field in the environment of the system part is provided, which generator is connected to an organic magnetoresistive OMR semiconductor element that is arranged stationary in the environment of the system component to be monitored, and a voltage source for generating an electrical voltage between two electrodes of the OMR semiconductor element is provided. The device and the method can be fitted in a simple manner and cost-effectively to almost any system part, even at a later stage to already existing systems. A corresponding display shows the desired information locally limited and in the simplest manner: if the electric conductor is currently energized, an additional evaluation is not necessary.

17 Claims, 4 Drawing Sheets

(58) Field of Classification Search
USPC .......................................................... 324/537
See application file for complete search history.

(56) References Cited

U.S. PATENT DOCUMENTS

| 2011/0001469 A1* | 1/2011 | Rau ............................... 324/149 |
| 2011/0175603 A1* | 7/2011 | Burtman .............. G01R 33/098 324/244 |

FOREIGN PATENT DOCUMENTS

| DE | 102006019483 A1 * | 10/2007 | ............. G01R 15/20 |
| DE | 102007040399 | 3/2009 | |
| DE | 102007040399 A1 * | 3/2009 | ............. G01R 15/20 |
| EP | PCT/EP2011/064228 | 8/2011 | |
| JP | 6-14974 | 2/1994 | |
| JP | 9-189723 | 7/1997 | |
| JP | 09189723 A * | 7/1997 | ............. G01R 15/20 |
| JP | 2004-20371 | 1/2004 | |
| JP | 2005-108609 | 4/2005 | |
| JP | 2006-164814 | 6/2006 | |
| JP | 2009-199853 | 9/2009 | |

OTHER PUBLICATIONS

G. Veeraraghavan et al., "Magnetic field effects on current, electroluminescence and photocurrent in organic light-emitting diodes," Journal of Physics: Condensed Matter, vol. 19, No. 3, Jan. 24, 2007, pp. 1-13.

English Language Copy of International Search Report for PCT/EP2011/064228, mailed Sep. 29, 2011, 3 pages.

WIPO English Language Translation of the Written Opinion for PCT/EP2011/064228, Downloaded from WIPO Website Feb. 18, 2014, 8 pages.

Chinese Office Action for Related Chinese Patent Application No. 201180072925.1, issued on Apr. 3, 2015 with partial German and English language translations, 23 pages.

German language copy of Japanese Office Action for related Japanese Patent Application No. 2014-525327, issued on Feb. 9, 2015, 14 pages.

German language translation of Japanese Office Action for related Japanese Patent Application No. 2014-525327, issued Aug. 27, 2015, 7 pages.

* cited by examiner

DEVICE AND METHOD FOR MONITORING THE STATE OF A SYSTEM COMPONENT

CROSS REFERENCE TO RELATED APPLICATIONS

This application is based on and hereby claims priority to International Application No. PCT/EP2011/064228 filed on Aug. 18, 2011, the contents of which are hereby incorporated by reference.

BACKGROUND

The invention relates to an apparatus for monitoring the state of an installation component of a installation through which current potentially flows.

The visual representation of whether electrical conductors are instantaneously free of current or carrying current is necessary for safety and also for functional reasons in many electrical apparatuses and installations and switchgear cabinets, e.g. in medium-voltage technology.

The present-day solutions are based on various sensor principles for current or voltage, the output signals of which for state monitoring are usually based on the outputting of an electrical variable (voltage, current, resistance) in the low-voltage range (converters). Said variable is usually transmitted to an output device and correspondingly visualized (lamps, display). Since the current is measured by these sensors locally, it is necessary to carry out measurement at a plurality of locations or branches depending on the flow of current. A direct optical local assignment is therefore not possible.

SUMMARY

One possible object is to specify a method and an apparatus which make it possible to monitor the state of installation components through which current potentially flows, and in so doing avoid the disadvantages mentioned.

The inventors propose an apparatus for detecting the present state of the installation component comprising a field generating device, which is connected to the installation component to be monitored and which generates a magnetic field in a vicinity of the installation part, and also an organic magnetoresistive OMR semiconductor element, which is arranged in a stationary manner in the vicinity of the installation component to be monitored, and a voltage source for generating an electrical voltage between two electrodes of the OMR semiconductor element.

The inventors also propose a method for determining a state of a potentially current-carrying installation component, in particular of an electrical conductor of a technical installation, where a magnetic field is generated, which is detected in a vicinity of the installation component by an organic magnetoresistive OMR semiconductor element. An electrical variable is set by the semiconductor element in a manner dependent on the detected magnetic field.

With the proposed apparatus, it is possible to determine the present state, in particular the through-flow of current, in accordance with the proposed method in the following manner. The field generating device generates a magnetic field in a dependent manner on the installation component. Said field is detected in the vicinity of the installation component by the OMR semiconductor element. This enables an electrical variable to be set in a manner dependent on the detected magnetic field by the OMR semiconductor element. Said electrical variable can be, for example, the electrical voltage dropped between the electrodes or an electric current brought about by said voltage.

The apparatus and the method have the advantages that a display can be applied to virtually any installation parts in a simple and cost-effective manner, including subsequently in already existing installations. A corresponding display displays in a locally restricted manner extremely simply the desired information (the electrical conductor is at present occupied by current); an additional evaluation is not necessary.

The OMR semiconductor element can be embodied as a layer surrounding the electrical conductor or the desired installation component at least in regions. As a result, the magnetic field is detected over a comparatively large area by the OMR semiconductor element in comparison with detection by a Hall sensor or an AMR sensor. This results in averaging effects during the measurement, which provide for a measurement signal having little fluctuation. One preferred embodiment of the apparatus comprises an OMR semiconductor element having the form of a hollow cylinder. In this case, this hollow-cylindrical OMR semiconductor element surrounds the conductor in a circumferential direction, with the result that a fluctuation of the measurement signal is effectively suppressed. An OMR semiconductor element in the form of a segment of a hollow cylinder may prove likewise to be expedient since this can be removed (for example for repair purposes) with little effort.

A further advantage arises if the OMR semiconductor element is arranged on a flexible substrate. This permits a very simple, space-saving construction of a housing of the apparatus and enables simple, cost-effective mounting of the sensor system.

Another development of the apparatus provides a measuring device for measuring a variable proportional to a current flowing through the OMR semiconductor element and/or a voltage present at the OMR semiconductor element. Said variable can be, for example, the current and/or the voltage itself or an electrical voltage dropped across a further element through which flows the same current as the OMR semiconductor element. On the basis of a measurement signal for the variable, it is advantageously possible to provide automatic monitoring or to form a control signal for a display.

A particularly good measurement effect arises if the OMR semiconductor element is operated with a constant voltage within an operating range in which the OMR semiconductor element has a maximum field sensitivity. Accordingly, one advantageous development of the apparatus provides for the voltage source to be designed as a constant-voltage source. In this case, the field sensitivity indicates the change dR in the electrical resistance of the OMR semiconductor element relative to a change in the magnetic field strength dH, that is to say dR/dH.

In accordance with another advantageous development of the apparatus, an OLED, that is to say an organic light emitting diode, is formed by the OMR semiconductor element. This can be achieved by a corresponding choice of the organic semiconductor material used for producing the OMR semiconductor element. By an OLED, a visual representation of the current conduction present on the electrical conductor or installation component is made possible in a manner that is easy to realize.

Another advantageous type of optical display is provided if the electrical voltage generated between the electrodes of the OLED is set to a value at which the OLED emits light only if the measured value fulfills a predetermined criterion.

In a further advantageous configuration, the OMR semiconductor element or OLED is fitted to the installation component in a reversible manner. In that case, in a reversible manner is taken to mean that the corresponding apparatus is equipped correspondingly such that it can be secured to the installation part without any problems and without any residues, that is to say not in a permanently fixed manner, and in particular is embodied as a band/strip/tape and in particular with an integrated power supply. The specific configuration can be implemented in the form e.g. as clip band or adhesive tape.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1A:
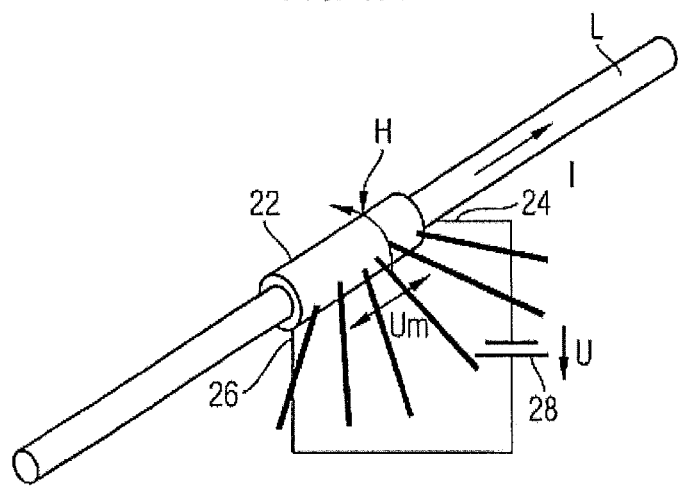
FIGS. 1A and 1B show schematic illustrations of a sensor in accordance with two potential embodiments of the proposed apparatus.

Reference will now be made in detail to the preferred embodiments of the present invention, examples of which are illustrated in the accompanying drawings, wherein like reference numerals refer to like elements throughout.

Figure 2:
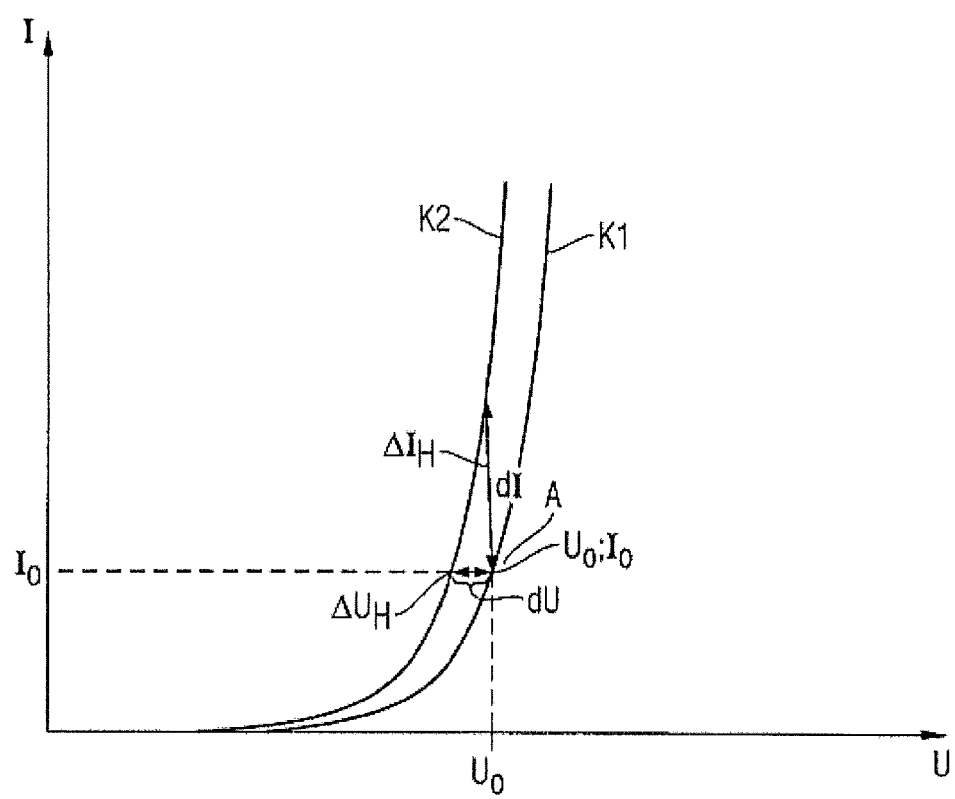
FIG. 2 shows a basic profile of characteristic curves of an OLED.

The simple visual representation of current conduction is based on the properties of OMR semiconductor elements or organic magnetoresistive light emitting diodes (OLEDs) and the physical relationship of current I and magnetic field, as illustrated in FIG. 2.

According to Ampère's circuital law, any current flow I generates a magnetic curl field H. In the event of a certain field strength being exceeded, the OMR semiconductor element—designated hereafter as the OLED for short—emits in the visible range (colored). In a simple image, therefore, the functional principle in the case of a constant voltage supply of the OLED can be represented as follows:

with a constant control voltage, 28, the OLED, 22, is kept just below the current threshold for highly visible emission of light (photoluminescence threshold). By the external magnetic field, the current flow in the OLED is increased by the OMR effect to an extent that a highly visible luminous effect arises. Therefore, without a further technical aid for representing the current flow a visualization along the entire coated electrical connection is possible.

The layer composed of the organic semiconductor material situated on the sleeve 22 is electrically connected to a voltage source 28 via two electrodes 24, 26. The voltage source 28 generates an electrical voltage U having the voltage value U0 between the electrodes 24, 26. For the case where no current flows on the conductor, an electric current I having the current intensity I0 flows through the OLED as a result. This corresponds to an operating point A on a U/I characteristic curve K1 of the organic semiconductor material. A characteristic curve K2 arises if the organic semiconductor material is permeated by a magnetic field having a specific, higher field strength. As a result, for the case where the voltage source 28 generates a constant voltage U having the voltage value U0, the current I rises by a current intensity value dI. By contrast, if a constant current I having the current intensity I0 is generated by the voltage source 28, then the voltage U decreases by a voltage value dU.

Figure 1B:
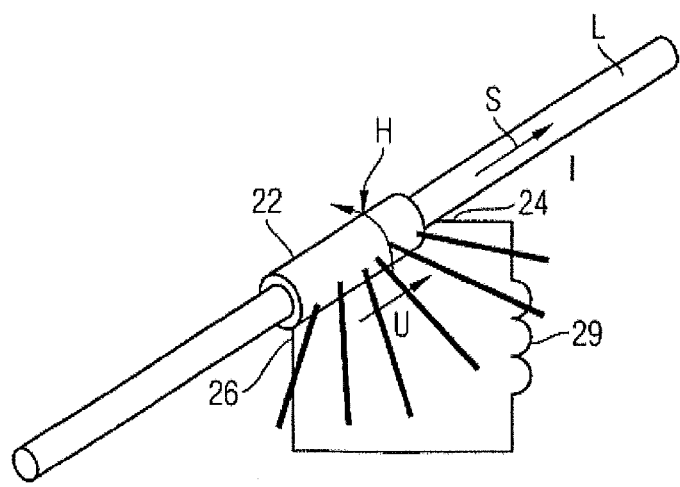

If a constant-voltage source 29, for example a battery, is used as voltage source 28, it is possible to obtain, for quantitatively measuring the magnetic field, a current increase dI of approximately ten to thirty percent relative to I0 by the arrangements shown in FIGS. 1a and 1b. This enables the change in the magnetic field strength to be measured very accurately.

The current I and the voltage Um are electrical variables which are altered by the magnetoresistive effect of the OLED in a manner dependent on the magnetic field. Instead of the voltage Um, a measurement current can also be measured by the measuring circuit.

The organic semiconductor material constitutes an OLED which emits light if the current intensity of the current I flowing through it exceeds a specific current intensity value. The voltage U of the voltage source 28 is set in such a way that the luminous effect commences if the current flow acting on the shaft 14 is greater than a preset maximum permissible value. As a result, the fact that a current I is flowing on the conductor L is then indicated to an operator of the installation A directly by luminescent regions L1 to L12 of the OLED.

In one embodiment, for the purpose of forming a layer, the organic semiconductor material can be applied to a flexible substrate. This can involve, for example, polyethylene (PET) or a polyimide (PI), such as is obtainable for instance under the designation KAPTON® polyethylene or polyimide.

Figure 3A:
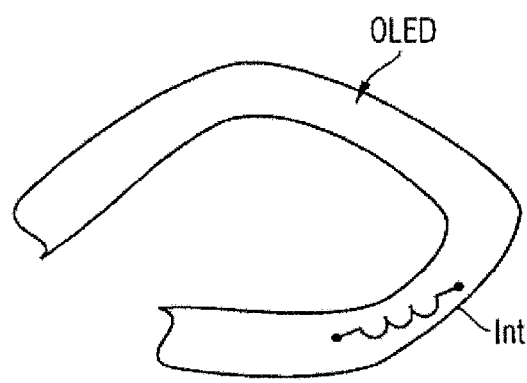
FIGS. 3A and 3B show schematic illustrations of two embodiments of the apparatus in different configurations.
Figure 3B:
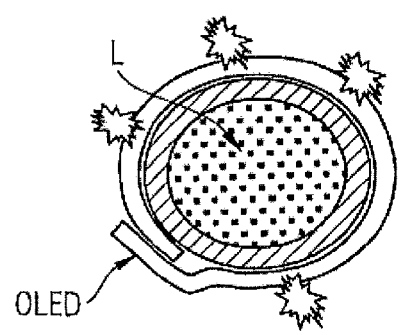

In an embodiment illustrated in FIG. 3a, the OMR semiconductor element/OLED can be embodied as a band/strip/tape having an integrated power supply Int. Specifically, this can be implemented in the form e.g. also as a clip band or adhesive tape OLED, FIG. 3b.

In this form it can be secured subsequently, without interventions in an existing installation, to the conductors to be monitored, illustrated in cross section in the figure, L, and also be removed again as necessary. It is thereby already possible for the start-up or fault finding also to be considerably facilitated by simultaneous parallel monitoring of the current flow in an installation.

Figure 4:
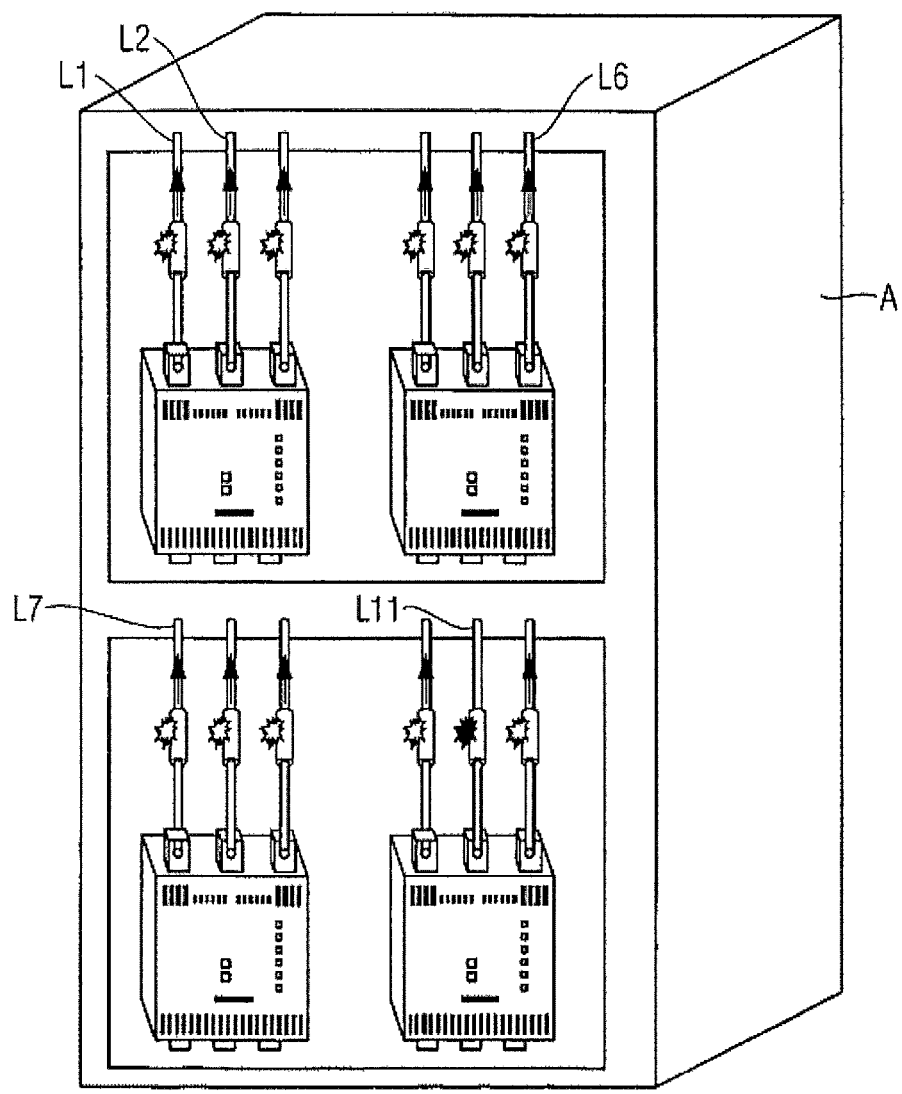
FIG. 4 shows an exemplary application of the apparatus in an industrial installation.

By an areal and continuous coating of current-carrying installation parts, e.g. of the conductor, and the unambiguous local relationship between the light emission and the current intensity, direct information is provided along the entire current conductor, cf. an exemplary illustration of an industrial installation A in FIG. 4. This allows rapid detection of the operating state or respectively the through-flow of current in the individual lines and thus high certainty in the assessment of current conduction on the current-carrying installation parts. The sleeves led around the affected conductors or the coatings applied to the affected conductors emit light, L1-L10, L12, if a current flow is present, or do not emit light, L11. In this regard, in the event of a malfunction, the fact of, for example, whether a disturbance is present in the power supply can be detected at a glance and without further evaluation tools.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in *Superguide v. DIRECTV*, 69 USPQ2d 1865 (Fed. Cir. 2004).

The invention claimed is:

1. An apparatus for determining a state of a current-carrying installation component, comprising:
   a field generating device configured to generate a magnetic field in a vicinity of the installation component, the field generating device coupled to the installation component to be monitored,
   an organic magnetoresistive semiconductor element disposed in a stationary manner in the vicinity of the installation component to be monitored, and
   a constant voltage source to generate an electrical voltage between two electrodes of the organic magnetoresistive semiconductor element, said organic magnetoresistive semiconductor element being disposed on a flexible substrate and which results in a current increase of ten to thirty percent,
   wherein the organic magnetoresistive semiconductor element is configured to operate with a constant voltage from the constant voltage source within an operating range in which the organic magnetoresistive semiconductor element has a maximum field sensitivity.

2. The apparatus as claimed in claim 1, wherein the organic magnetoresistive semiconductor element comprises a layer surrounding the current-carrying installation component at least in regions.

3. The apparatus as claimed in claim 1, further comprising a measuring device for measuring a variable proportional to a current flowing through the organic magnetoresistive semiconductor element or a voltage present at the organic magnetoresistive semiconductor element.

4. The apparatus as claimed in claim 1, wherein an organic light emitting diode is formed by the organic magnetoresistive semiconductor element.

5. The apparatus as claimed in claim 1, wherein the organic magnetoresistive semiconductor element is fitted to the installation component in a reversible manner.

6. The apparatus as claimed in claim 1, wherein the current-carrying installation component comprises an electrical conductor of a technical installation.

7. The apparatus as claimed in claim 2, wherein the layer surrounding the current-carrying installation component comprises a hollow cylinder.

8. The apparatus as claimed in claim 4, the electrical voltage being set to a value at which the organic light emitting diode emits light only if the installation component to be monitored fulfills a predetermined criterion.

9. The apparatus as claimed in claim 5, wherein the organic magnetoresistive semiconductor element is a clip band, a hook-and-loop strip or an adhesive tape.

10. The apparatus as claimed in claim 2, wherein the organic magnetoresistive semiconductor element is disposed on a flexible substrate.

11. The apparatus as claimed in claim 10, further comprising a measuring device for measuring a variable proportional to a current flowing through the organic magnetoresistive semiconductor element or a voltage present at the organic magnetoresistive semiconductor element.

12. The apparatus as claimed in claim 11, wherein an organic light emitting diode is formed by the organic magnetoresistive semiconductor element.

13. The apparatus as claimed in claim 12, wherein the organic magnetoresistive semiconductor element is fitted to the installation component in a reversible manner.

14. The apparatus as claimed in claim 13, wherein the organic magnetoresistive semiconductor element is a clip band, a hook-and-loop strip or an adhesive tape.

15. A method for determining a state of a potentially current-carrying installation component, comprising:
   generating a magnetic field on the installation component,
   detecting the magnetic field in a vicinity of the installation component with an organic magnetoresistive semiconductor element,
   generating an electrical voltage between two electrodes of the organic magnetoresistive semiconductor element with a constant voltage source, said organic magnetoresistive semiconductor element being disposed on a flexible substrate and which results in a current increase of ten to thirty percent, wherein the organic magnetoresistive semiconductor element is configured to operate with a constant voltage from the constant voltage source within an operating range in which the organic magnetoresistive semiconductor element has a maximum field sensitivity, and
   setting an electrical variable configured to be dependent on the magnetic field detected by the organic magnetoresistive semiconductor element.

16. The method as claimed in claim 15, further comprising:
   forming an organic light emitting diode by the organic magnetoresistive semiconductor element; and
   setting the electrical voltage to a value at which the organic light emitting diode emits light only if the installation component to be monitored fulfills a predetermined criterion.

17. A system for determining a state of a potentially current-carrying installation component, comprising:
   means for generating a magnetic field on the installation component;
   means for detecting the magnetic field in a vicinity of the installation component;
   means for generating a constant voltage between two electrodes of an organic magnetoresistive semiconductor element, said organic magnetoresistive semiconductor element being disposed on a flexible substrate and which results in a current increase of ten to thirty percent, wherein the organic magnetoresistive semiconductor element is configured to operate with a constant voltage from the constant voltage source within an operating range in which the organic magnetoresistive semiconductor element has a maximum field sensitivity, and
   means for setting an electrical variable configured to be dependent on the magnetic field.

* * * * *